(12) United States Patent
Apelsmeier et al.

(10) Patent No.: US 10,742,141 B2
(45) Date of Patent: Aug. 11, 2020

(54) ELECTRICAL DRIVE SYSTEM

(71) Applicant: AUDI AG, Ingolstadt (DE)

(72) Inventors: Andreas Apelsmeier, Pollenfeld (DE); Maximilian Schiedermeier, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/025,132

(22) Filed: Jul. 2, 2018

(65) Prior Publication Data

US 2019/0123665 A1    Apr. 25, 2019

(30) Foreign Application Priority Data

Oct. 23, 2017    (DE) .................. 10 2017 218 866

(51) Int. Cl.
| | | |
|---|---|---|
| *H02P 5/74* | (2006.01) | |
| *B60K 1/02* | (2006.01) | |
| *H02M 7/5395* | (2006.01) | |
| *B60L 50/51* | (2019.01) | |
| *B60L 15/00* | (2006.01) | |
| *B60L 50/60* | (2019.01) | |
| *H01L 29/16* | (2006.01) | |
| *H01L 29/739* | (2006.01) | |
| *H01L 29/78* | (2006.01) | |
| *H01L 29/861* | (2006.01) | |

(52) U.S. Cl.
CPC .................. *H02P 5/74* (2013.01); *B60K 1/02* (2013.01); *B60L 15/007* (2013.01); *B60L 50/51* (2019.02); *H02M 7/5395* (2013.01); *B60L 50/66* (2019.02); *B60L 2210/40* (2013.01); *B60L 2240/52* (2013.01); *H01L 29/16* (2013.01); *H01L 29/1608* (2013.01); *H01L 29/7393* (2013.01); *H01L 29/7801* (2013.01); *H01L 29/861* (2013.01)

(58) Field of Classification Search
CPC .......... H02P 5/74; B60K 1/02; B60L 11/1803; B60L 11/1877; B60L 2210/40; H01L 29/1608; H02M 7/5395
See application file for complete search history.

(56) References Cited

U.S. PATENT DOCUMENTS

| | | | |
|---|---|---|---|
| 9,397,657 B1 | 7/2016 | Zhao et al. | |
| 2001/0017470 A1* | 8/2001 | Takaoka | B60W 20/10 290/40 C |

(Continued)

FOREIGN PATENT DOCUMENTS

| | | |
|---|---|---|
| DE | 10 2010 014 971 A1 | 10/2011 |
| DE | 11 2014 006 826 T5 | 3/2017 |

(Continued)

OTHER PUBLICATIONS

Search Report dated Jan. 22, 2019 in corresponding European Application No. 18177926.5; 11 pages including partial machine-generated English-language translation.

(Continued)

*Primary Examiner* — Kawing Chan
*Assistant Examiner* — Bradley R Brown
(74) *Attorney, Agent, or Firm* — Maier & Maier, PLLC

(57) ABSTRACT

An electrical drive system having multiple drive units for motor vehicles, especially for pure electric vehicles, and a method for operating the drive system.

7 Claims, 2 Drawing Sheets

(56) References Cited

U.S. PATENT DOCUMENTS

| | | | |
|---|---|---|---|
| 2011/0080125 A1* | 4/2011 | Shimada | H02P 5/74 |
| | | | 318/400.09 |
| 2012/0186391 A1* | 7/2012 | Boskovitch | B60L 50/15 |
| | | | 74/661 |
| 2015/0246614 A1 | 9/2015 | Dames et al. | |
| 2016/0191046 A1* | 6/2016 | Zhao | H03K 17/567 |
| | | | 327/432 |
| 2017/0179842 A1 | 6/2017 | Tanaka et al. | |
| 2017/0213811 A1 | 7/2017 | Das et al. | |

FOREIGN PATENT DOCUMENTS

| | | |
|---|---|---|
| DE | 10 2016 207 254 A1 | 4/2017 |
| DE | 10 2016 207 286 A1 | 11/2017 |
| EP | 2 456 065 A2 | 5/2012 |
| WO | 2016/002057 A1 | 1/2016 |
| WO | 2016/014901 A1 | 1/2016 |
| WO | 2017/186390 A1 | 11/2017 |

OTHER PUBLICATIONS

Examination Report dated Mar. 1, 2018 of corresponding German application No. 10 2017 218 866.9; 7 pgs.

Ozdemir, S. et al., "Comparison of Silicon Carbide MOSFET and IGBT Based Electric Vehicle Traction Inverters", International Conference on Electrical Engineering and Informatics (ICED), 2015, p. 1-4; 4 pgs.

Search Report dated Feb. 6, 2020 in corresponding European Application No. 18 177 926.5; 9 pages including partial machine-generated English-language translation.

\* cited by examiner

ELECTRICAL DRIVE SYSTEM

FIELD

The present invention relates to an electrical drive system comprising multiple drive units for motor vehicles, especially for pure electric vehicles, and a method for operating the drive system.

BACKGROUND

In purely electrically driven motor vehicles, such as battery electrical vehicles (BEV) or fuel cell vehicles, multiple drive units are often provided on different axles. In each of the drive units, the same power electronics with Si power semiconductors is used.

Today's vehicles still have a relatively low range and the costs for the HV battery are high. Therefore, the present invention has established the object of making available a drive system which can achieve a predetermined range with lower battery capacity and with no power losses.

The efficiency of power electronic components can be increased significantly by using, instead of silicon-based semiconductor components, components based on silicon carbide (SiC).

US 2015/246614 A1 discloses an inductive energy transfer system built into a roadway. It is possible to use silicon carbide semiconductor components in the unit supplying the induction coils in order to switch the currents flowing through the induction coils.

Known from DE 10 2016 207 254 A1 are an inverter for the providing of phase currents for an electric machine and an electrical drive arrangement for a hybrid electric vehicle/electric vehicle with such an inverter. The inverter comprises a conduction switch, designed as a silicon carbide semiconductor switch, which closes automatically when the control signal is cut off. The conduction switch may be a MOSFET or IGBT.

Originating from WO 2016/002057 A1 is a silicon carbide semiconductor component that can be used in a power module, an inverter, and a three-phase motor system for an electric vehicle.

Thanks to a traction inverter based on SiC (SiC inverter), a savings of up to approximately 0.5 kWh/100 km can be achieved in a vehicle with a drive in the WLTP cycle (Worldwide Harmonized Light-Duty Vehicles Test Procedure) or NEFZ cycle (New European Driving Cycle according to directive 70/220/EWG). For a vehicle range of 500 km, this enables a lowering of the battery capacity by around 2.5 kWh.

In the normal driving mode of a vehicle with two electrical drive units, one drive unit is chiefly under load and the other one is merely entrained with it. Only when there is a torque demand that the first drive unit alone cannot satisfy is the second drive unit additionally switched in. The torque distribution between the drive units is primarily shifted to one drive unit, for reasons of efficiency.

SUMMARY

According to the invention, in a drive system with multiple electrical drives, at least one inverter with silicon carbide semiconductor components (SiC inverter) and at least one inverter with silicon semiconductor components (conventional Si inverter) are combined. This combination offers a number of advantages. The low load range in driving mode is handled by the highly efficient SiC inverter. This reduces the battery capacity needed to achieve the required range. A battery of lower capacity may be used in the vehicle, which results in savings. The lower battery capacity furthermore enables a percentage reduction in the charging time. The overall power of the drive system remains the same, since the SiC inverter is supplemented by the Si inverter. The motor vehicle exhibits the same performance as a vehicle with two Si inverters.

The subject of the invention is an electrical drive system for a motor vehicle, comprising at least two electric machines as well as at least one inverter with silicon semiconductor components and at least one inverter with silicon carbide semiconductor components.

The electrical drive system for a motor vehicle according to the invention comprises at least two electric machines (e-machines). In one embodiment, it comprises three e-machines. In one embodiment, it comprises four e-machines. In one embodiment, one e-machine drives a front axle of the motor vehicle and another e-machine drives a rear axle of the motor vehicle. In another embodiment, each wheel of the motor vehicle is driven by its own e-machine.

Each of the e-machines is supplied with alternating current by a separate inverter assigned to it. The drive system comprises at least one inverter with silicon semiconductor components and at least one inverter with silicon carbide semiconductor components. In one embodiment, the drive system comprises two e-machines, one inverter with silicon semiconductor components and one inverter with silicon carbide semiconductor components. In another embodiment, the drive system comprises four e-machines, two inverters with silicon semiconductor components and two inverters with silicon carbide semiconductor components.

The layout of inverters is familiar in principle to the person skilled in the art. An inverter generates an alternating voltage for the operation of an e-machine from the DC voltage provided by an HV battery or a fuel cell. In one embodiment of the drive system according to the invention, the inverters are sine wave inverters, i.e., they generate a sinusoidal alternating voltage. In one embodiment, the inverters generate a sinusoidal output alternating voltage in chopper mode by pulse width modulation (PWM). With the transistors used as switching elements (such as IGBT or MOSFET), a sinusoidal alternating voltage is recreated from short pulses of high frequency by pulse width modulation (PWM) in chopper mode. The transistors periodically reverse the polarity of the DC voltage with high frequency. In one embodiment, the switching frequency of the inverter lies in a range of 10 to 25 kHz. The mean value of the high-frequency, pulse-width-modulated switching frequency is the output alternating voltage. The output alternating voltage is composed of small pulses of varying width, thereby approximating the sinusoidal voltage form.

In one embodiment, the at least one inverter with silicon semiconductor components (Si inverter) comprises at least one Si-IGBT and at least one Si-diode, i.e., IGBT and diode are made as silicon semiconductors. In one embodiment, the at least one inverter with silicon carbide semiconductor components (SiC inverter) comprises at least one SiC-MOSFET, i.e., a MOSFET fabricated from silicon carbide semiconductors. In another embodiment, the SiC inverter comprises at least one Si-IGBT and at least one SiC diode.

The subject of the invention is also a method for operating the electrical drive system according to the invention. In driving mode of the motor vehicle, electric machines supplied solely via SiC inverters are used to propel the motor vehicle when the torque demand is less than a maximum torque that can be produced by E-machines supplied via SiC inverters. If the torque demand is greater than the maximum torque that can be produced by the electric machines supplied via SiC inverters, E-machines supplied by a SiC inverter, both E-machines supplied by a SiC inverter, as well as E-machines supplied by a Si inverter are used to propel the motor vehicle. In one embodiment of the method, the front axle of the motor vehicle is driven by at least one E-machine supplied by a Si inverter, and the rear axle of the motor vehicle is driven by at least one E-machine supplied by a SiC inverter.

It is understood that the features mentioned above and yet to be discussed hereafter may be used not only in the particular indicated combination, but also in other combinations or standing alone, without leaving the scope of the present invention.

BRIEF DESCRIPTION OF THE DRAWINGS

The invention is represented schematically on the basis of embodiments in the drawings and shall be described further with reference to the drawings. There are shown.

DETAILED DESCRIPTION

FIG. 1 shows a comparison of the power loss of different inverters at a constant load point for different clock frequencies: a) full-load operation, b) partial load operation). The inverters used were operated with a maximum power of 180 kW, a maximum voltage of 1200 V HL, an alternating current averaged over 10 s of 350 Arms. The inverters were designed for a maximum temperature at the junction of 175° C. (Si inverter) or 200° C. (SiC inverter).

The loss data was determined from measurements. The boundary conditions for the calculation were cos Phi: 0.7; maximum modulation rate: 0.9; efficiency of e-machine+transmission: 0.9*0.94; DC voltage: 800V.

Figure 1A:
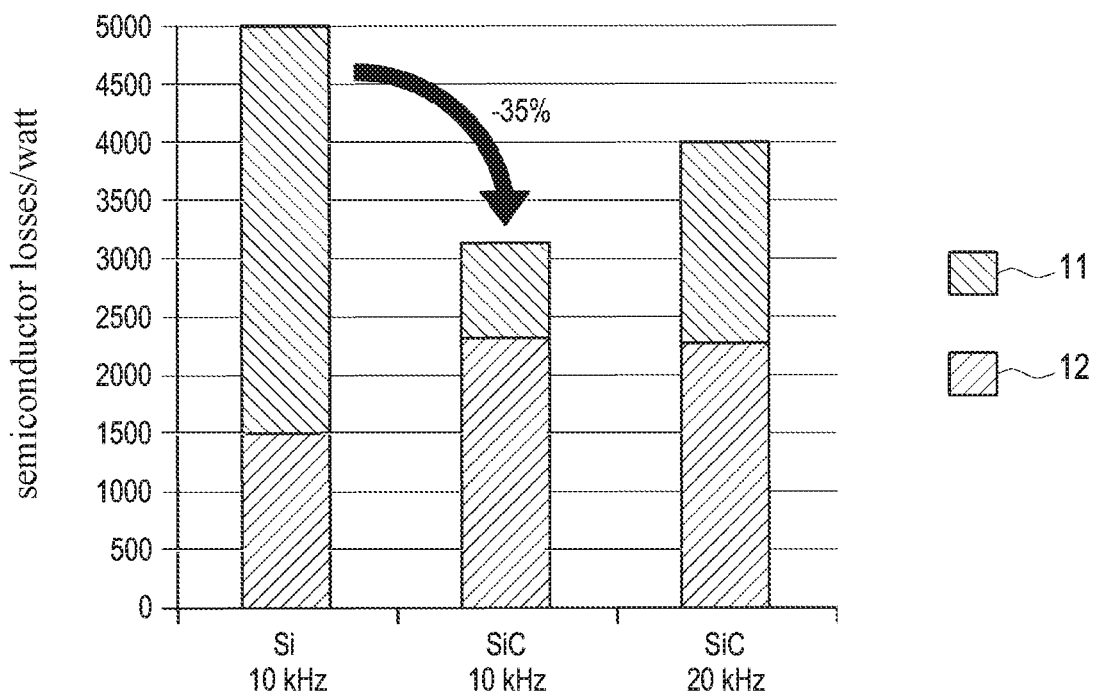
FIG. 1a a comparison of the power loss of different inverters.
Figure 1B:
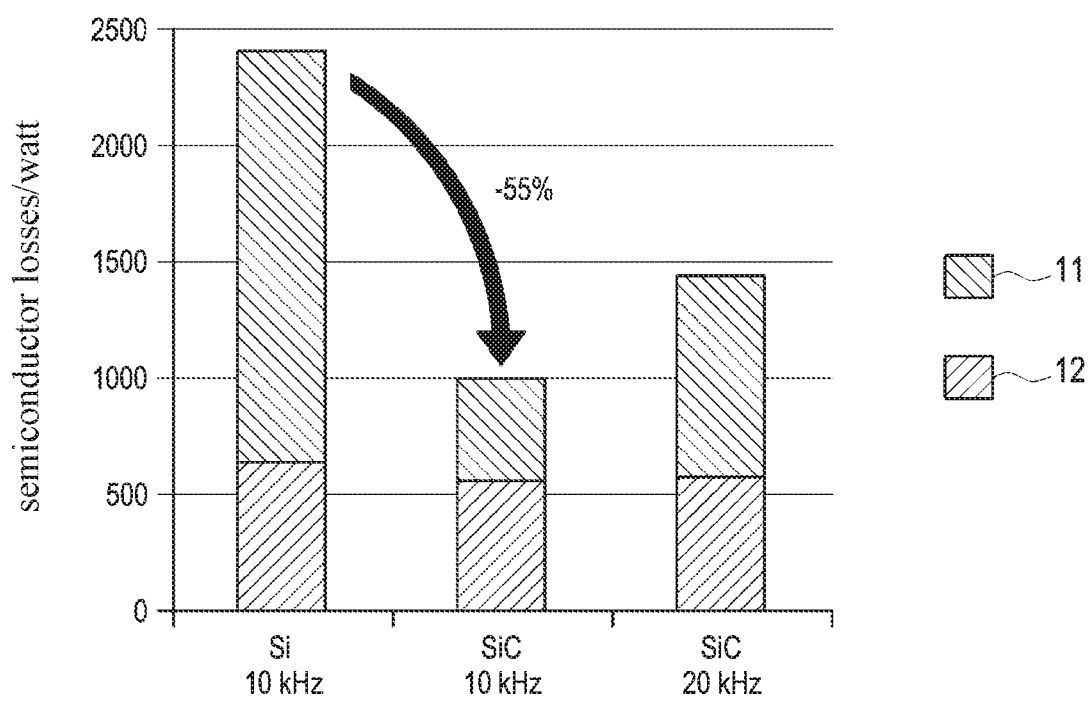
FIG. 1b a comparison of the power loss of different inverters.

As can be seen from FIG. 1a, the power loss of a SiC inverter in full-load operation (350 Arms, switching frequency 10 kHz) is 35% less than that of a Si inverter. The power loss is represented as the sum of the switching losses 11 and the conduction losses 12. The decrease is due to the much smaller switching losses 11. In partial load operation (FIG. 1b) with 175 Arms, there results in fact a reduction in the power loss of 55% at a switching frequency of 10 kHz. As can be seen, the differences in the losses are less in the high-load region than in the partial load region.

Figure 2:
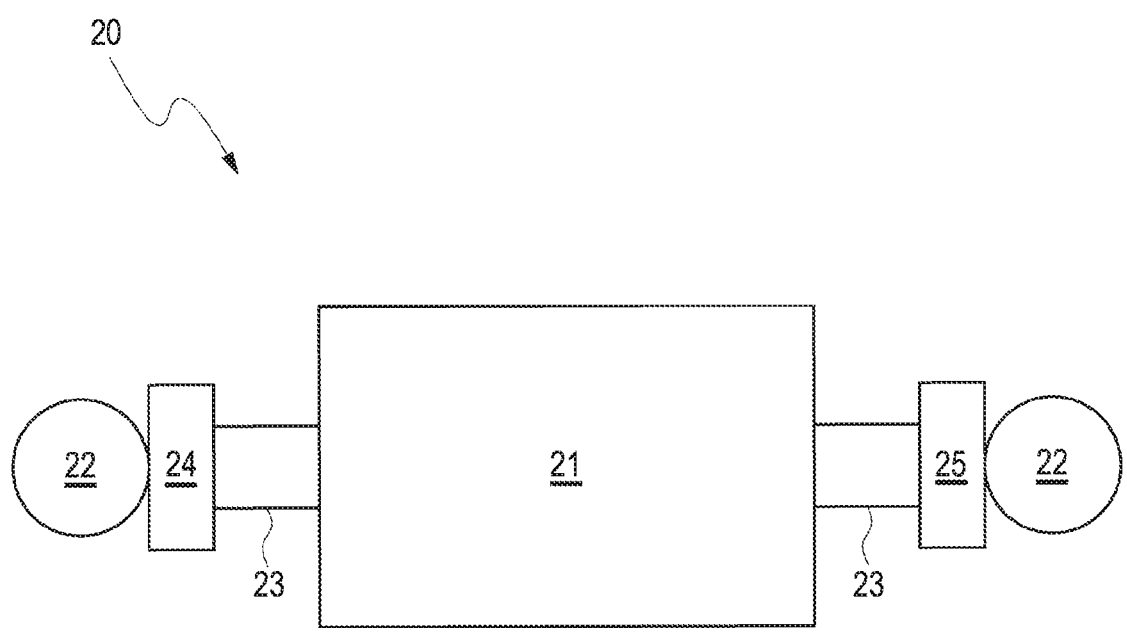
FIG. 2 a schematic representation of one embodiment of a drive system according to the invention with two different inverters.

FIG. 2 shows a schematic representation of a drive system 20 with two different inverters 24 and 25. One Si inverter 24 supplies a first e-machine 22, and one SiC inverter 25 supplies a second e-machine 22. The two inverters 24 and 25 are each connected by DC-HV cable 23 to a HV battery 21, which provides the direct current for the operation of the inverters 24 and 25. The first e-machine 22 connected to the Si inverter 24 may be arranged, for example, on the front axle of the motor vehicle and drive it, and the second e-machine 22 connected to the SiC inverter 25 can be arranged on the rear axle of the motor vehicle and drive it. Of course, more than two drive units may also be combined with each other in one vehicle.

The invention claimed is:

1. An electrical drive system for a motor vehicle, comprising:
at least two electric machines as well as at least one inverter with silicon (Si) semiconductor components and at least one inverter with silicon carbide (SiC) semiconductor components, wherein the inverters are sine wave inverters.
wherein the inverters generate a sinusoidal output voltage by pulse width modulation in chopper mode,
wherein the switching frequency of the inverters lies in a range of 10 kHz to 25 kHz,
wherein at least one electric machine of the at least two electric machines is supplied by the at least one Si inverter and is designed to drive a front axle of the motor vehicle, and at least one electric machine of the at least two electric machines is supplied by the at least one SiC inverter and is designed to drive a rear axle of the motor vehicle.

2. The electrical drive system as claimed in claim 1, wherein the inverter with silicon semiconductor components comprises at least one Si-IGBT and at least one Si-diode.

3. The electrical drive system as claimed in claim 1, wherein the inverter with silicon carbide semiconductor components comprises at least one SiC-MOSFET.

4. The electrical drive system as claimed in claim 1, wherein the inverter with silicon carbide semiconductor components comprises at least one Si-IGBT and at least one SiC diode.

5. A method for operating the electrical drive system in driving mode of the motor vehicle comprising:
supplying electric machines supplied with alternating current solely via SiC inverters are used to drive the motor vehicle when a torque demand is less than a maximum torque that can be produced by the electric machines supplied via SiC inverters; and
supplying electric machines supplied with alternating current by both SiC inverters as well as electric machines supplied with alternating current by Si inverters are used to drive the motor vehicle when the torque demand is greater than the maximum torque that can be produced by electric machines supplied with alternating current via SiC inverters,
wherein the front axle of the motor vehicle is driven by at least one electric machine supplied by a Si inverter, and the rear axle of the motor vehicle is driven by at least one electric machine supplied by a SiC inverter,
wherein the inverters are sine wave inverters,
wherein the inverters generate a sinusoidal output voltage by pulse width modulation in chopper mode,
wherein the switching frequency of the inverters lies in a range of 10 kHz to 25 kHz.

6. The electrical drive system as claimed in claim 2, wherein the inverter with silicon carbide semiconductor components comprises at least one SiC-MOSFET.

7. The electrical drive system as claimed in claim 2, wherein the inverter with silicon carbide semiconductor components comprises at least one Si-IGBT and at least one SiC diode.

* * * * *